US008870454B2

(12) United States Patent
Makinwa et al.

(10) Patent No.: US 8,870,454 B2
(45) Date of Patent: Oct. 28, 2014

(54) MULTIPLE ELECTROTHERMAL-FILTER DEVICE

(75) Inventors: Kofi A. A. Makinwa, Delft (NL); Caspar P. L. Van Vroonhoven, Delft (NL)

(73) Assignee: Stichting voor de Technische Wetenschappen, Utrecht (NL)

( * ) Notice: Subject to any disclaimer, the term of this patent is extended or adjusted under 35 U.S.C. 154(b) by 369 days.

(21) Appl. No.: 13/374,130

(22) Filed: Dec. 13, 2011

(65) Prior Publication Data
US 2013/0147528 A1 Jun. 13, 2013

(51) Int. Cl.
H03L 7/00 (2006.01)
H03L 7/08 (2006.01)

(52) U.S. Cl.
USPC ............ 374/170; 702/57; 341/119; 327/2

(58) Field of Classification Search
CPC ......... H03L 2207/50; H03L 7/02; H03L 7/08; H03L 7/0814; H01L 35/00; Y10S 323/907
USPC ........ 374/170, 57, 117–119, 1, 171; 327/1, 3, 327/159, 141, 100, 334; 702/57; 341/156, 341/161–163, 167, 169, 172, 110, 118, 119, 341/111
See application file for complete search history.

(56) References Cited

U.S. PATENT DOCUMENTS

| | | | |
|---|---|---|---|
| 3,566,690 A | 3/1971 | Ebrahimi | 374/178 |
| 4,520,320 A | 5/1985 | Potzick et al. | 327/7 |
| 5,713,665 A | 2/1998 | Kato et al. | 374/43 |
| 6,121,848 A | 9/2000 | Sauer | 331/108 C |
| 6,208,215 B1 * | 3/2001 | Sauer | 331/108 C |
| 6,518,847 B1 | 2/2003 | Sauer | 331/66 |
| 7,920,032 B2 | 4/2011 | Makinwa et al. | 331/176 |
| 8,013,636 B2 * | 9/2011 | Makinwa et al. | 327/3 |
| 8,222,940 B2 * | 7/2012 | Kashmiri et al. | 327/159 |

FOREIGN PATENT DOCUMENTS

| | | | |
|---|---|---|---|
| EP | 605408 A1 * | 7/1994 | |
| WO | WO 2006/132531 | 12/2006 | |
| WO | WO 2009/096787 | 8/2009 | |
| WO | WO 2011/093708 | 1/2010 | |

OTHER PUBLICATIONS

EPO Search Report and Written Opinion, Apr. 4, 2013.
PCT Search Report and Written Opinion, Apr. 18, 2011.
V. Szekely et al., "Test structure for thermal monitoring", in *Proc. 1996 IEEE Int. Conf. on Microelectronic Test Structures*, vol. 9, Mar. 1996, pp. 111-115.

(Continued)

Primary Examiner — Gail Verbitsky
(74) Attorney, Agent, or Firm — Steven Stupp

(57) ABSTRACT

During operation of the device, a drive circuit may provide a drive signal having a fundamental frequency to two electrothermal filters (ETFs) having different temperature-dependent time constants. In response to the drive signal, the two ETFs may provide signals having the fundamental frequency and phases relative to the drive signal corresponding, respectively, to the time constants of the ETFs. Then, phase-shift values of the phases may be measured using a phase detector, and a signal may be output based on the phase-shift values. Note that the signal may correspond to a value that is a function of a temperature of the device.

15 Claims, 10 Drawing Sheets

(56) References Cited

OTHER PUBLICATIONS

M.A.P. Pertijs, K.A.A. Makinwa and J.H. Huijsing, "A CMOS temperature sensor with a 3σ inaccuracy of ±0.1° C from -55° C to 125° C," *Digest of Technical Papers ISSCC*, pp. 238-596, Feb. 2005.

K.A.A. Makinwa and M.F. Snoeij, "CMOS Temperature-to-Frequency Converter with an Inaccuracy of +0.5C (3c) from -40 to 105C," *J. Solid-State Circuits*, vol. 41, is. 12, pp. 2992-2997, Dec. 2006.

"Advances in Silicon Technology Enables Replacement of Quartz-Based Oscillators," Silicon Laboratories, White Paper, Sep. 2008.

M. Kashmiri, S. Xia and K.A.A. Makinwa, "A Temperature-to-Digital Converter Based on an Optimized Electrothermal Filter," *J. Solid-State Circuits*, vol. 44, is. 7, pp. 2026-2035, Jul. 2009.

M. Kashmiri, K. A. A. Makinwa, "A Digitally-Assisted Electrothermal Frequency Locked Loop," *Proc. of ESSCIRC*, Sep. 2009, pp. 296-299.

S.M. Kashmiri et al., Measuring the Thermal Diffusivity of CMOS Chips, *IEEE Sensors*, Oct. 2009, pp. 45-48.

S.K. Souri, M. Kashmiri and K.A.A. Makinwa, "A CMOS Temperature Sensor with an Energy-Efficient Zoom ADC and an Inaccuracy of ±0.25° C (3σ) from -40 to 125° C," *Digest ISSCC*, pp. 310-311, Feb. 2010.

S.M. Kashmiri, M.A.P. Pertijs and K.A.A. Makinwa, "A Thermal-Diffusivity-Based Frequency Reference in Standard CMOS with an Absolute Inaccuracy of ±0.1% from—55 to 125° C," *J. Solid-State Circuits*, vol. 45, is. 12, pp. 2510-2520, Dec. 2010.

T. Hirai, T. Asai and Y. Amemiya, "A CMOS Phase-Shift Oscillator Based on the Conduction of Heat," Journal of Circuits, Systems, and Computers, vol. 19, No. 4 (2010) 763-772.

C.P.L. van Vroonhoven and K.A.A. Makinwa, "An SOI Thermal-Diffusivity-Based Temperature Sensor with ±0.6° C (3σ) Untrimmed Inaccuracy from -70° C to 170° C," Transducers 2011, Beijing, China, Jun. 5, 2011, pp. 2887-2890.

\* cited by examiner

US 8,870,454 B2

MULTIPLE ELECTROTHERMAL-FILTER DEVICE

CROSS REFERENCE TO RELATED APPLICATIONS

This application is related to U.S. Non-Provisional patent application Ser. No. 12/931,185, entitled "Electrothermal Frequency Reference," by Sayyed M. Kashmiri et al., filed on Jan. 26, 2011, the contents of which are herein incorporated by reference.

FIELD OF THE INVENTION

The present disclosure relates generally to a device that includes multiple electrothermal filters with different thermal time constants, and the outputs a signal based on thermally-induced phase shifts in the electrothermal filters.

BACKGROUND

Many components in integrated-circuit technology are strongly dependent on process variations and temperature. As a consequence, it is often difficult to create precision analog circuits in standard CMOS technology. Although matching between devices can be highly accurate (greater than 16-bit), typically high absolute accuracy of electrical components can only be achieved by trimming.

However, because the silicon used in integrated-circuit technology is very pure, the thermal properties of chips are often more accurate than their electrical properties. For example, the rate at which heat diffuses through silicon (i.e., the thermal diffusivity of silicon, $D_{Si}$) is usually essentially process-independent.

One technique for measuring $D_{Si}$ involves an electrothermal filter (ETF). FIG. 1 presents a drawing illustrating an existing ETF, which includes a heater and a (relative) temperature sensor (such as a thermopile), spaced at a distance s, are implemented on the substrate of a silicon chip. During operation of this ETF, heat pulses, which are continuously generated at a fundamental frequency $f_{drive}$, diffuse through the silicon and create low-pass-filtered temperature fluctuations across the thermopile. The thermopile converts these temperature fluctuations into a signal $V_{ETF}$ with a phase shift $\phi_{ETF}$ (relative to $f_{drive}$) given by $$\phi_{ETF} \propto s \cdot \sqrt{\frac{f_{drive}}{D_{Si}}}.$$

For s equal to 24 µm, the thermal delay associated with an ETF is about 2.5 µs at room temperature. It has been shown that the device-to-device spread of this thermal delay is mainly a function of the lithographic inaccuracy with which s can be defined. In particular, ETFs with identical s (equal to 24 µm), implemented in 0.7 µm and 0.18 µm CMOS technology, respectively, had untrimmed spreads in their thermal delays of 0.14% (3σ) and 0.045% (3σ). In other words, $D_{Si}$ is insensitive to process spread up to at least this level (greater than 11 bits) and in theory, is expected to be significantly more accurate.

Applications of ETFs include: highly accurate temperature sensors (because $D_{Si}$ is also a well-defined function of absolute temperature T); and frequency references generated by using a loop that locks an oscillator to the thermal delay of an ETF (which are sometimes referred to as electrothermal frequency-locked loops or EFLLs). FIG. 2 presents a block diagram of an existing temperature sensor based on an ETF. When the ETF is driven at a constant frequency, its phase shift $\phi_{ETF}$ is a function of temperature (approximately proportional to $T^{0.9}$). A phase digitizer converts $\phi_{ETF}$ to a digital representation of temperature. If an accurate clock, such as a clock generated by a crystal oscillator (which are typically available in digital systems), is used to drive the ETF, then the untrimmed temperature-sensing inaccuracy of an ETF-based temperature sensor (over the military temperature range of −55 to 125 C) can be as low as ±0.2 C (3σ). Because ETFs do not suffer from the electrical non-idealities that are typically observed at extremely low or high temperatures, their operating range (and, thus, the operating range of ETF-based temperature sensors) can exceed −70 to 200 C.

FIG. 3 presents an existing frequency reference based on an EFLL. During operation of this frequency reference, feedback forces the oscillator to output a frequency at which $\phi_{ETF}$ equals $\phi_{SET}$. However, because $\phi_{ETF}$ is temperature dependent, an integrated temperature sensor is typically required to compensate for the temperature dependence of $D_{Si}$. For example, the integrated temperature sensor can be based on the well-known temperature dependence of bipolar junction transistors (BJTs). In this way, 0.1% (1000 ppm) 16 MHz frequency references have been fabricated. Nonetheless, the large leakage currents of BJTs at high temperatures gave rise to temperature-sensing errors as large as ±3.0 C at 200 C. As a consequence, the operating range of this frequency reference was limited to −55 to 125 C.

While the performance of the ETF-based temperature sensor and the EFLL-based frequency reference are comparable to the state of the art, problems remain. In the case of the ETF-based temperature sensor, the need for an accurate frequency reference usually precludes stand-alone operation. This constraint often limits ETF-based temperature sensors to applications such as the thermal management of digital chips (e.g., microprocessors), where an accurate frequency reference is readily available. While this is a large and growing market, there is also an increasing need for accurate and robust stand-alone temperature sensors in other applications (such as: automotive, industrial and space applications), which are usually not serviced by existing integrated temperature sensors. However, accurate frequency references are often unavailable in these other applications. While this problem can, in principle, be addressed by including an oscillator on the chip to provide a clock, in practice such oscillators usually have poor absolute accuracy and poor temperature dependence because of component tolerances, which can greatly increase the measurement error (often to much more than ±1 C).

The use of EFLL-based frequency references is often limited by their inaccuracy, which is largely determined by the strong temperature dependence of $D_{Si}$. This strong temperature dependence imposes strict inaccuracy and noise requirements on the temperature sensors used to temperature-compensate EFLL-based frequency references. Indeed, even if the ETF was perfectly accurate, the use of a state-of-the-art ±0.1 C temperature sensor would still limit the frequency inaccuracy of EFLL-based frequency references to about 800 ppm. This is a problem because most frequency reference applications require inaccuracies between 10 and 100 ppm.

Therefore, there is a need for an ETF-based temperature sensor and an EFLL-based frequency reference without the problems listed above.

SUMMARY OF THE INVENTION

One embodiment of the present disclosure provides a device that includes: a drive circuit, an electrothermal filter (ETF) having a temperature-dependent time constant, a second ETF having a second temperature-dependent time constant (which is different than the time constant), and a phase detector. During operation, the drive circuit generates a drive signal having a fundamental frequency for the ETF and the second ETF, and the ETF provides a signal having the fundamental frequency and a phase relative to the drive signal corresponding to the time constant. Moreover, the second ETF provides a second signal having the fundamental frequency and a second phase relative to the drive signal corresponding to the second time constant. Furthermore, the phase detector measures a phase-shift value corresponding to the phase and a second phase-shift value corresponding to the second phase, and outputs a signal based on the phase-shift value and the second phase-shift value.

Note that the signal may correspond to a value that is a function of a temperature of the device. Thus, the device may provide a temperature sensor.

Moreover, the device may include a compensation circuit that compensates for temperature-dependent frequency changes in the fundamental frequency output by the drive circuit by making at least one of the phase-shift value and the second phase-shift value substantially equal to a temperature-dependent phase reference so that the fundamental frequency is approximately independent of the temperature. In some embodiments, the temperature-dependent phase reference is based on the phase-shift value and the second phase-shift value. Furthermore, the device may include: a temperature sensor to measure a temperature of the device; and a phase-reference circuit that provides the temperature-dependent phase reference based on the measured temperature. Therefore, in some embodiments the device may provide an electrothermal frequency-locked loop (EFLL).

Additionally, the device may be disposed on a substrate that includes a semiconductor (such as silicon). In these embodiments, the time constant may be substantially associated with a thermal diffusivity of the semiconductor, and the second time constant may be associated with a thermal diffusivity of a material disposed on or in the substrate which is other than the semiconductor (such as an insulator, polysilicon and/or an oxide). For example, the time constant may be dominated by the thermal diffusivity of the semiconductor, and the second time constant may be dominated by the thermal diffusivity of the material. Moreover, the signal may be a function of the thermal diffusivity of the semiconductor and the thermal diffusivity of the material. For example, the signal may be a function of a ratio of the thermal diffusivity of the semiconductor to the thermal diffusivity of the material.

In some embodiments, the device may include: a substrate; an insulating layer disposed on the substrate; and a semiconductor layer disposed on the insulating layer, where the semiconductor layer includes a semiconductor. For example, the device may be implemented using silicon-on-insulator (SOI) technology. Note that the device may include a second insulating layer, which includes the material other than the semiconductor, disposed on or in the semiconductor layer. In these embodiments, the time constant may be substantially associated with the thermal diffusivity of the semiconductor, and the second time constant may be substantially associated with the thermal diffusivity of the material. Moreover, the signal may be a function of the thermal diffusivity of the semiconductor and the thermal diffusivity of the material. Alternatively or additionally, the second ETF may include at least one cavity, defined by a surface, in the semiconductor layer. This cavity, which may be along a heat-diffusion path of the second ETF, may include the material other than the semiconductor. For example, the cavity may be filled with the material.

Note that the thermal delay of the second ETF may provide a time reference for the device in the thermal domain so that the device is self-referenced without the need for an accurate external time reference.

Moreover, the drive circuit may provide phase-reference signals, and measuring the phase-shift value and the second phase-shift value may involve digitizing the phase and the second phase based on the phase-reference signals.

Furthermore, the signal may be a function of the phase-shift value and the second phase-shift value. For example, the signal may be a function of a ratio of the phase-shift value to the second phase-shift value.

Additionally, the phase detector may provide the signal based on a temperature-calibration setting (or a trim setting), which may have been determined by comparing the signal to a reference, and which may reduce errors in the signal. For example, the temperature-calibration setting may be stored in a storage component in the device, such as: a non-volatile memory, an array of resistors, a memory circuit and/or a fusable link. Note that the temperature-calibration setting may be determined from the coefficients of a polynomial, which may be implemented in the digital domain.

Another embodiment of the device includes: an oscillator circuit, an ETF, a second ETF, a phase detector and an output circuit. During operation, the oscillator circuit provides an analog electrical drive signal having a fundamental frequency. The ETF and the second ETF each include: a heater that receives the analog electrical signal, a thermal path, and a temperature sensor. However, the thermal path in the ETF includes a semiconductor having a temperature-dependent time constant, and the temperature sensor in the ETF provides an analog electrical output signal that has the fundamental frequency and a phase shift (associated with the time constant) relative to the analog electrical drive signal. In contrast, the thermal path in the second ETF includes the material other than the semiconductor which has a second temperature-dependent time constant that is different than the time constant, and the temperature sensor in the second ETF provides a second analog electrical output signal that has the fundamental frequency and a second phase shift (associated with the second time constant) relative to the analog electrical drive signal. Moreover, the phase detector converts the phase shift to a phase-shift value and the second phase shift to a second phase-shift value. Furthermore, the output circuit outputs a signal based on the phase-shift value and the second phase-shift value.

Another embodiment provides a method for providing an output signal using the device. During operation, the drive circuit in the device generates the drive signal having the fundamental frequency. In response to the drive signal, the ETF in the device (which has the temperature-dependent time constant) provides the signal having the fundamental frequency and the phase relative to the drive signal (which corresponds to the time constant). Similarly, in response to the drive signal, the second ETF in the device (which has the second temperature-dependent time constant) provides the second signal having the fundamental frequency and the second phase relative to the drive signal (which corresponds to the second time constant). Then, the phase detector in the device measures the phase-shift value of the phase and the second phase-shift value of the second phase. Moreover, the device provides the output signal based on the phase-shift value and the second phase-shift value.

Another embodiment provides an electronic device that includes an integrated circuit, where the device is implemented in the integrated circuit.

BRIEF DESCRIPTION OF THE DRAWINGS

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Embodiments of a device, an electronic device that includes the device, and a method for providing an output signal are described. During operation of the device, a drive circuit may provide a drive signal having a fundamental frequency to two electrothermal filters (ETFs) having different temperature-dependent time constants. In response to the drive signal, the two ETFs may provide signals having the fundamental frequency and phases relative to the drive signal corresponding, respectively, to the time constants of the ETFs. Then, phase-shift values of the phases may be measured using a phase detector, and a signal may be output based on the phase-shift values. Note that the signal may correspond to a value that is a function of a temperature of the device.

By using two ETFs with different temperature-dependent time constants, the device may be used to provide a highly accurate temperature sensor and/or a highly accurate frequency reference. Moreover, the temperature sensor may not need an external frequency reference (i.e., it may be self-referenced), facilitating stand-alone operation. Furthermore, the frequency reference may not need an external temperature sensor (i.e., it may be self-compensated). These highly accurate integrated components, which can be fabricated using low-cost standard CMOS integrated-circuit technology, may address long-standing needs in a wide variety of applications.

Figure 1:
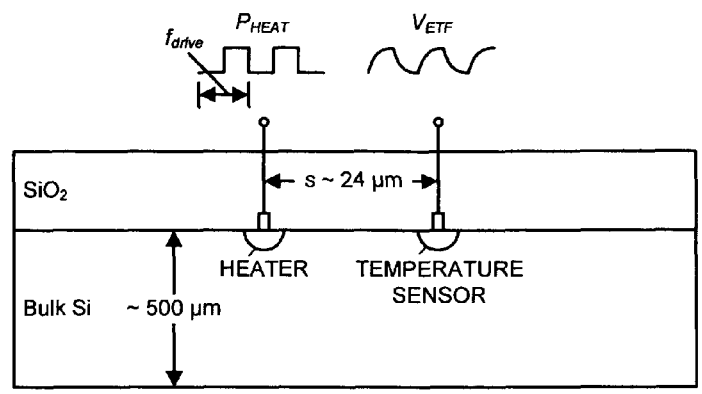
FIG. 1 is a drawing illustrating an existing electrothermal filter (ETF) implemented on a silicon substrate.
Figure 2:
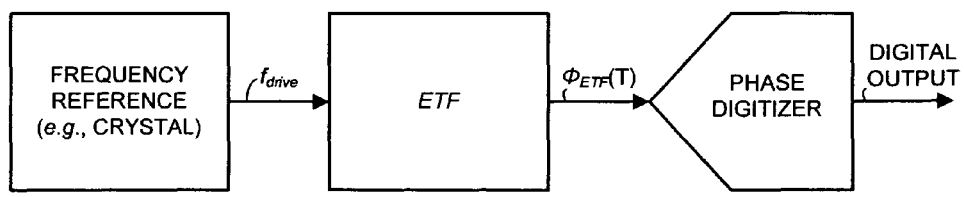
FIG. 2 is a drawing illustrating an existing of an existing temperature sensor based on an ETF.
Figure 3:
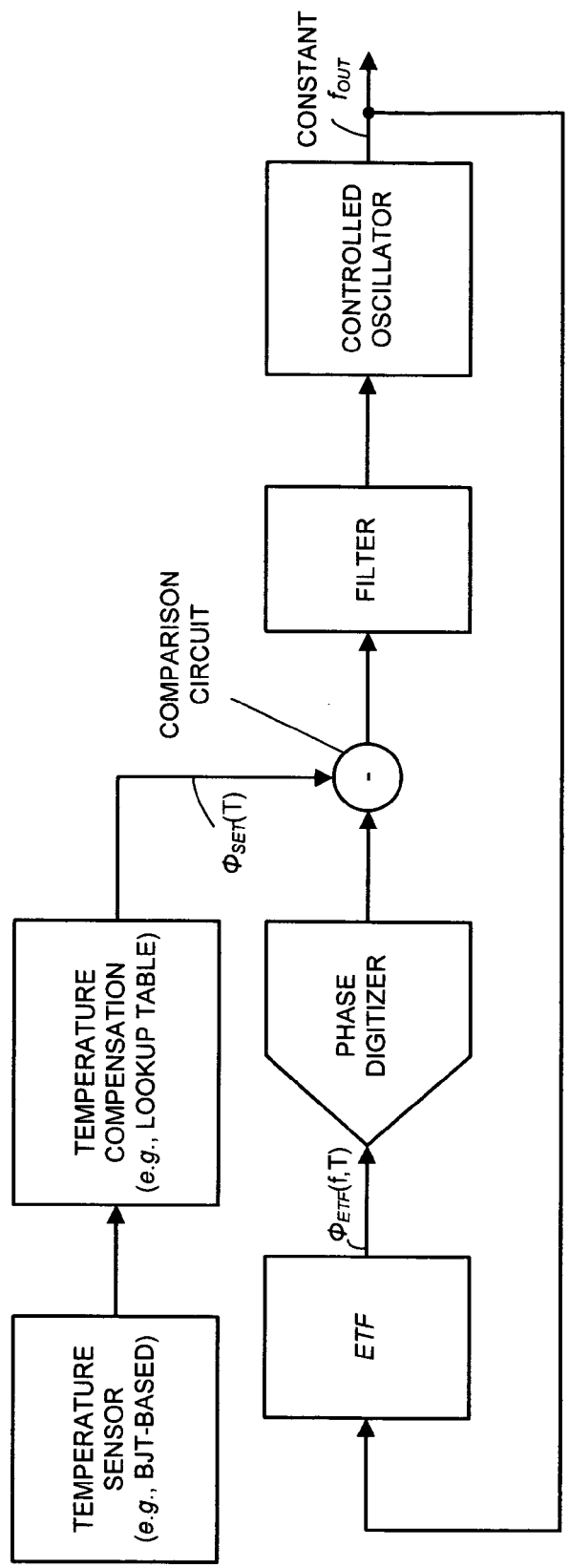
FIG. 3 is a drawing illustrating an existing frequency reference based on an electrothermal frequency-locked loop (EFLL).
Figure 4:
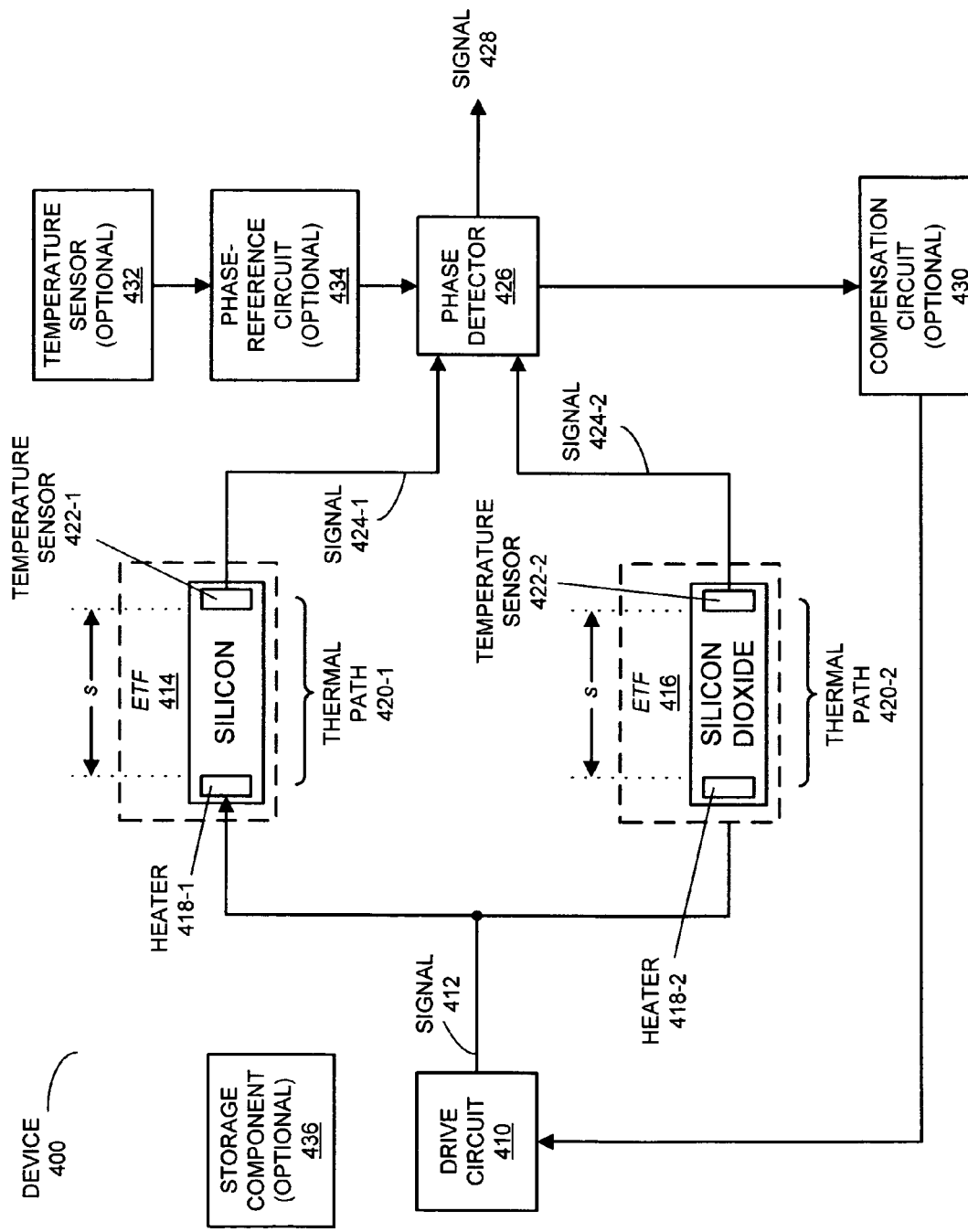
FIG. 4 is a block diagram illustrating a device that includes two ETFs in accordance with an embodiment.

We now describe embodiments of the device. FIG. 4 presents a block diagram illustrating a device 400. This device may include: a drive circuit 410 (such as a voltage-controlled oscillator or VCO and, more generally, an oscillator circuit), an ETF 414 having a temperature-dependent time constant, an ETF 416 having a second temperature-dependent time constant (which is different than the time constant), and a phase detector 426. During operation, drive circuit 410 generates a drive signal 412 (such as an analog electrical drive signal, which may be a continuous or a pulse signal) having a fundamental frequency ($f_{drive}$). In response to drive signal 412, ETF 414 provides a signal 424-1 (such as an analog electrical output signal) having the fundamental frequency and a phase ($\phi_{ETF1}$) relative to drive signal 412 (i.e., a phase shift) corresponding to the time constant. Moreover, in response to drive signal 412, ETF 416 provides a signal 424-2 (such as a second analog electrical output signal) having the fundamental frequency and a second phase ($\phi_{ETF2}$) relative to drive signal 412 corresponding to the second time constant (i.e., a second phase shift). Furthermore, phase detector 426 measures a phase-shift value of $\phi_{ETF1}$ and a second phase-shift value of $\phi_{ETF2}$, and outputs a signal 428 based on the phase-shift value and the second phase-shift value.

As described further below with reference to FIGS. 5-8, ETF 414 and ETF 416 may each include: one of heaters 418 (such as an $n^+$-diffusion heater) that receives drive signal 412, one of thermal (i.e., heat-diffusion) paths 420, and one of temperature sensors 422 (such as a $p^+$-diffusion/aluminum thermopile). In ETF 414, thermal path 420-1 may include a semiconductor (such as silicon) having the temperature-dependent time constant, and temperature sensor 422-1 may provide signal 424-1. Moreover, in ETF 416 thermal path 420-2 may include a material other than the semiconductor (such as silicon dioxide) having the second temperature-dependent time constant, and temperature sensor 422-2 may provide signal 424-2.

Figure 9:
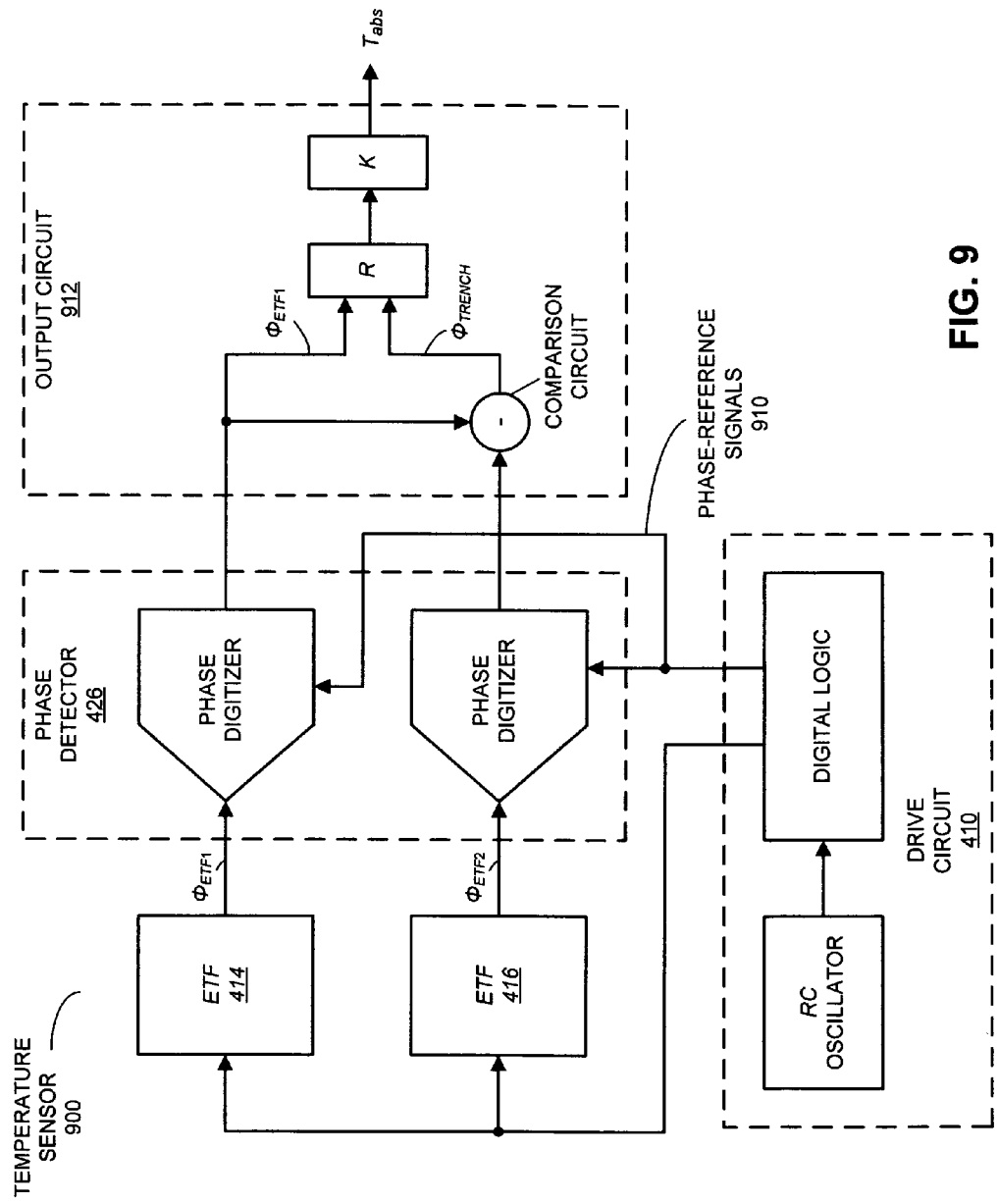
FIG. 9 is a block diagram illustrating a dual ETF-based temperature sensor in accordance with an embodiment.

Moreover, as described further below with reference to FIG. 9, signal 428 may correspond to a value that is a function of a temperature of device 400. Thus, device 400 may provide an ETF-based temperature sensor. Note that ETF 416 may provide a time reference for device 400 in the thermal domain so that device 400 is self-referenced without an external time reference (such as that provided by an accurate clock in a system that includes device 400). In these embodiments, signal 428 may be a function of the phase-shift value and the second phase-shift value. For example, signal 428 may be a function of a ratio of the phase-shift value to the second phase-shift value.

Figure 10:
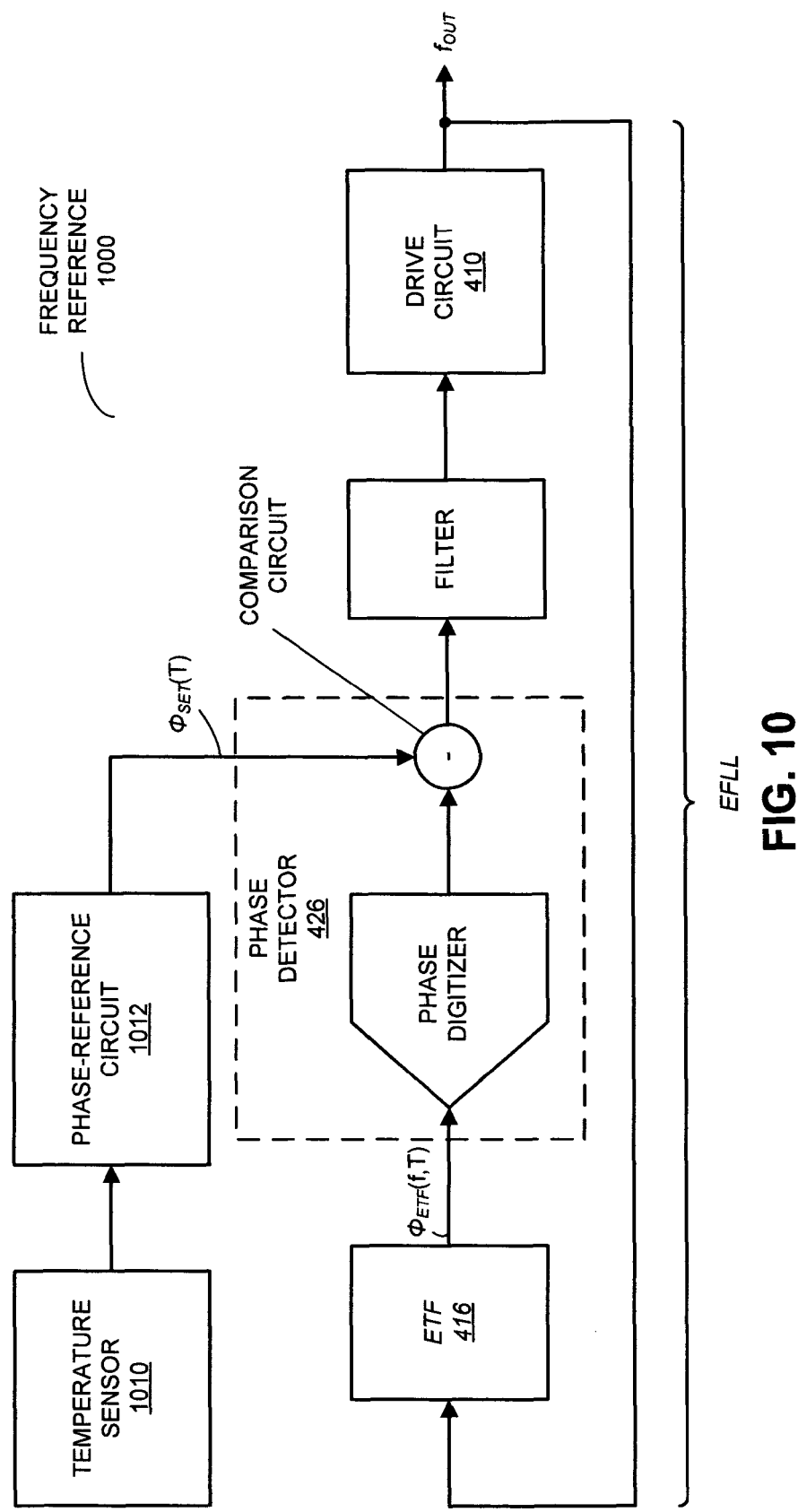
FIG. 10 is a block diagram illustrating an EFLL-based frequency reference in accordance with an embodiment.
Figure 11:
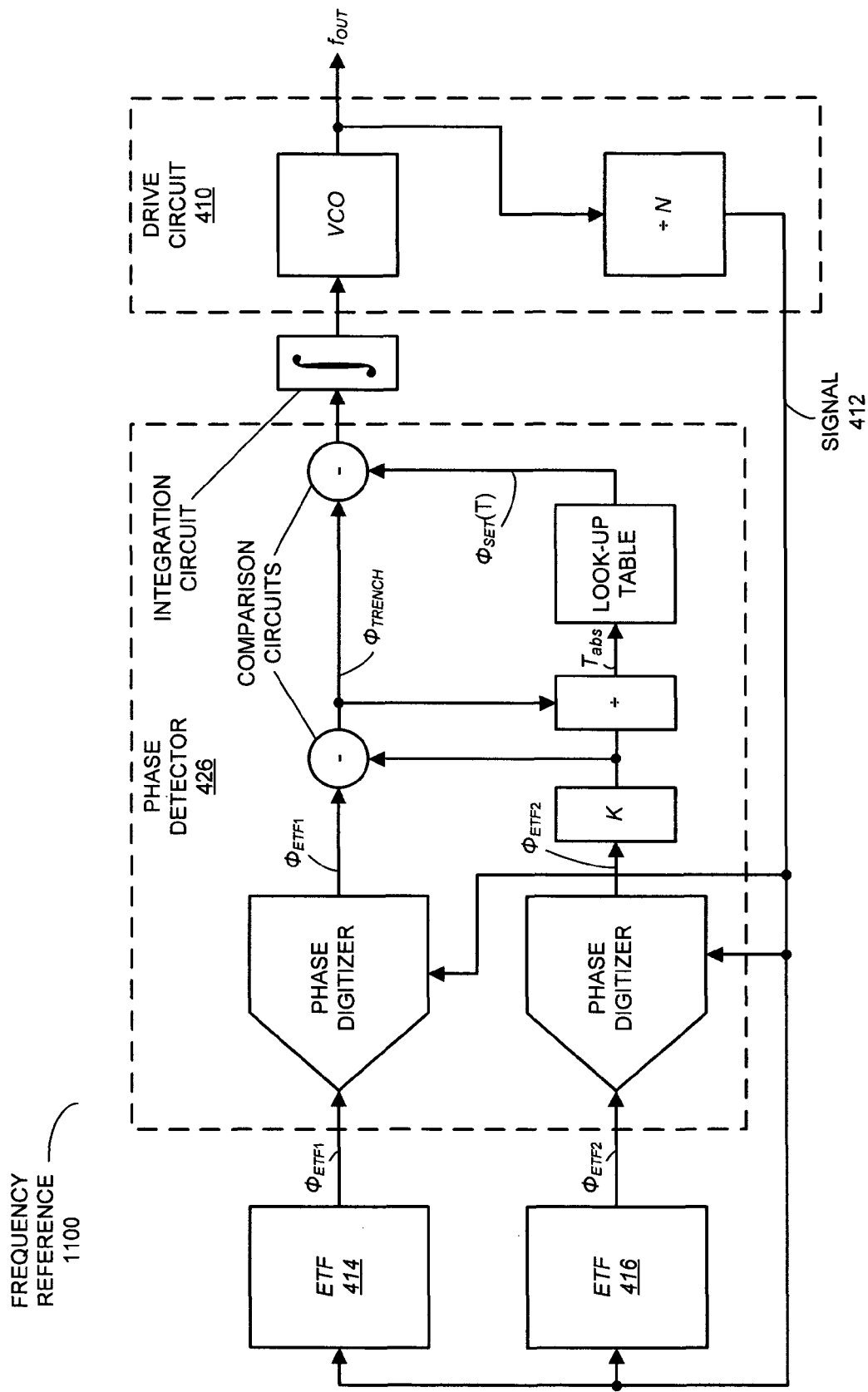
FIG. 11 is a block diagram illustrating a self-compensated EFLL-based frequency reference in accordance with an embodiment.

Furthermore, as described further below with reference to FIGS. 10 and 11, in some embodiments device 400 provides a frequency reference based on an electrothermal frequency-locked loop (EFLL). In particular, device 400 may include an optional compensation circuit 430 that compensates for temperature-dependent frequency changes in $f_{drive}$ output by drive circuit 410 to make at least one of the phase-shift value and the second phase-shift value substantially equal to a temperature-dependent phase reference so that $f_{drive}$ is approximately independent of the temperature. Moreover, the temperature-dependent phase reference may be based on the phase-shift value and the second phase-shift value. Furthermore, device 400 may include: an optional temperature sensor 432 to measure a temperature of device 400; and an optional phase-reference circuit 434 that provides the temperature-dependent phase reference based on the measured temperature.

In an exemplary embodiment, device 400 is disposed on a substrate that includes a semiconductor (such as silicon). For example, device 400 may be implemented or disposed on a semiconductor die (which is sometimes referred to as a 'chip' or an integrated circuit). In these embodiments, the time constant (and, thus, $\phi_{ETF1}$) may be substantially associated with a thermal diffusivity of the semiconductor, and the second time constant (and, thus, $\phi_{ETF2}$) may be associated with a thermal diffusivity of a material disposed on the substrate which is other than the semiconductor (such as an insulator, polysilicon and/or an oxide). For example, the time constant may be dominated by the thermal diffusivity of the semiconductor, and the second time constant may be dominated by the thermal diffusivity of the material. Moreover, signal 428 may be a function of the thermal diffusivity of the semiconductor and the thermal diffusivity of the material. For example, signal 428 may be a function of a ratio of the thermal diffusivity of the semiconductor to the thermal diffusivity of the material.

In these embodiments, thermal path 420-2 in ETF 416 may include silicon dioxide instead of silicon to create thermal delays that are based on its comparatively temperature-independent thermal diffusivity. In particular, for the amorphous oxides typically found in integrated-circuit technology (e.g., the gate, field and trench isolation oxides), $D_{SiO_2}$ is both 100× smaller and 20× less temperature-dependent than $D_{Si}$. Furthermore, these oxide layers are usually quite thin (the field oxide typically has a thickness $t_{OX}$ of approximately 300 nm), so their thermal resistance is limited while their associated phase shift $\phi_{OX}$, given by $$\phi_{OX} \propto t_{OX} \cdot \sqrt{\frac{f_{drive}}{D_{SiO_2}}},,$$

has values comparable to $\phi_{Si}$, the phase shift associated with silicon.

Figure 5:
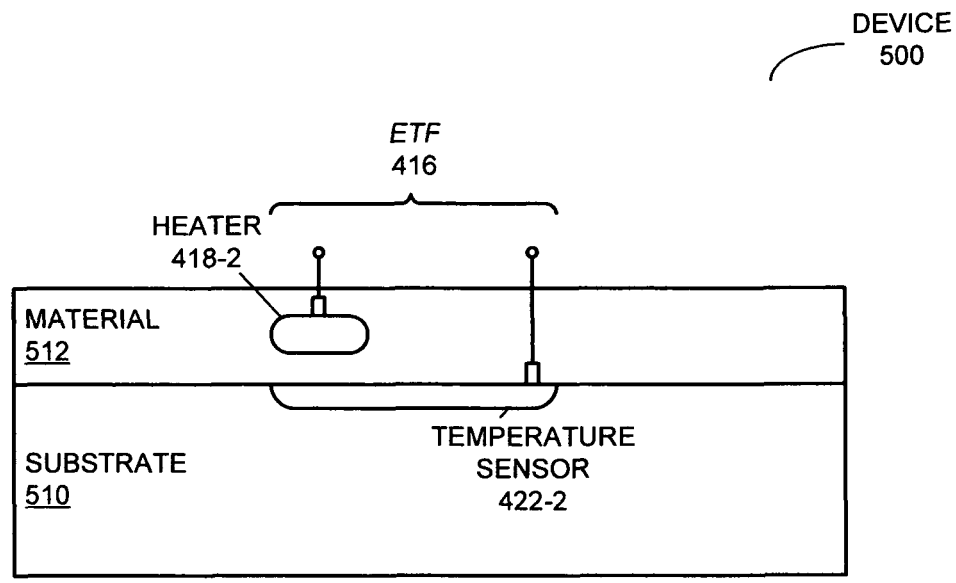
FIG. 5 is a drawing illustrating a device in accordance with an embodiment.
Figure 6:
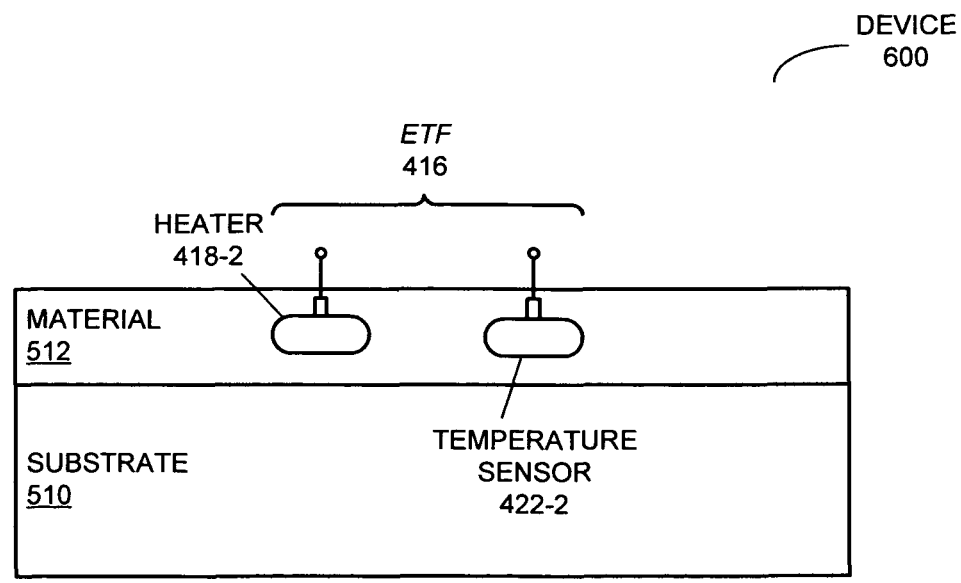
FIG. 6 is a drawing illustrating a device in accordance with an embodiment.

Two embodiments of ETF 416 are shown in FIG. 5 (which presents a drawing illustrating a device 500) and in FIG. 6 (which presents a drawing illustrating a device 600). In each example, ETF 416 is implemented using the field isolation oxide as material 512 disposed on substrate 510. Furthermore, heater 418-2 and temperature sensor 422-2 may be implemented using polysilicon.

In addition to using an oxide in thermal path 420-2 (FIG. 4), it is also possible to etch away the surrounding silicon to reduce its thermal filtering effect even more (i.e., to increase the thermal isolation of thermal path 420-2 in FIG. 4). For example, this can be done using semiconductor manufacturing and/or micro-machining techniques. This approach may be useful in the context of temperature compensation of MEMS devices, such as accelerometers and resonators.

Figure 7:
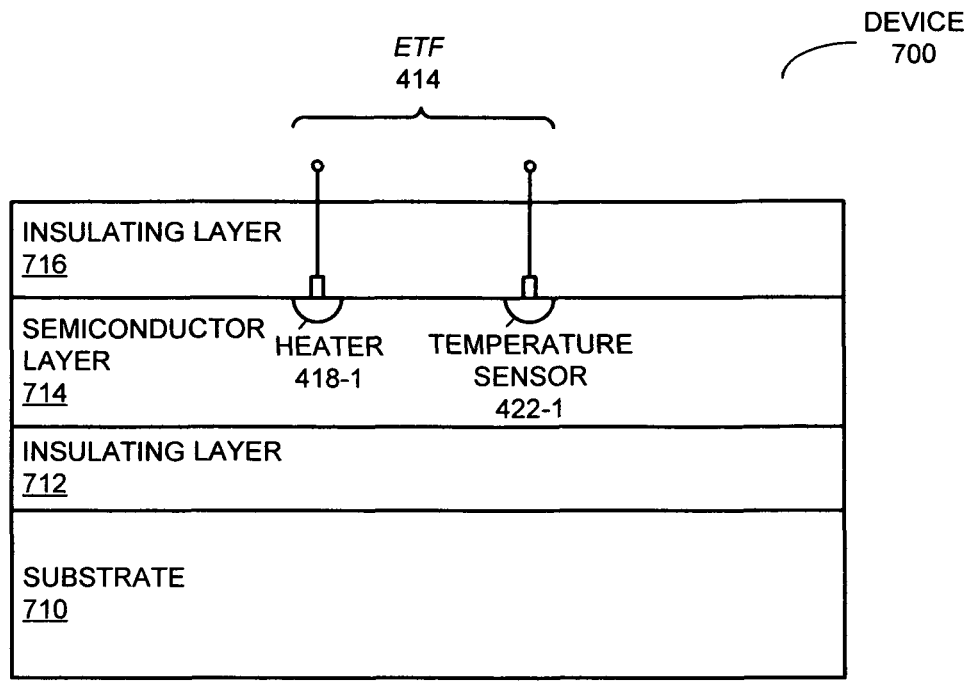
FIG. 7 is a drawing illustrating a device in accordance with an embodiment.

Another technique for sensing $D_{SiO_2}$ is by diffusing heat through the silicon-dioxide sidewalls of deep isolation trenches, which are typically found in silicon-on-insulator (SOI) integrated-circuit technology. In particular, as shown in FIG. 7, which presents a drawing illustrating a device 700, the device may include: a substrate 710 (which includes a semiconductor, such as silicon); an insulating layer 712 (such as silicon dioxide) disposed on substrate 710; and a semiconductor layer 714 (such as silicon) disposed on insulating layer 712. Furthermore, as shown in FIG. 7, an insulating layer 716, which includes the material other than the semiconductor (such as silicon dioxide), may be disposed on semiconductor layer 714.

Figure 8:
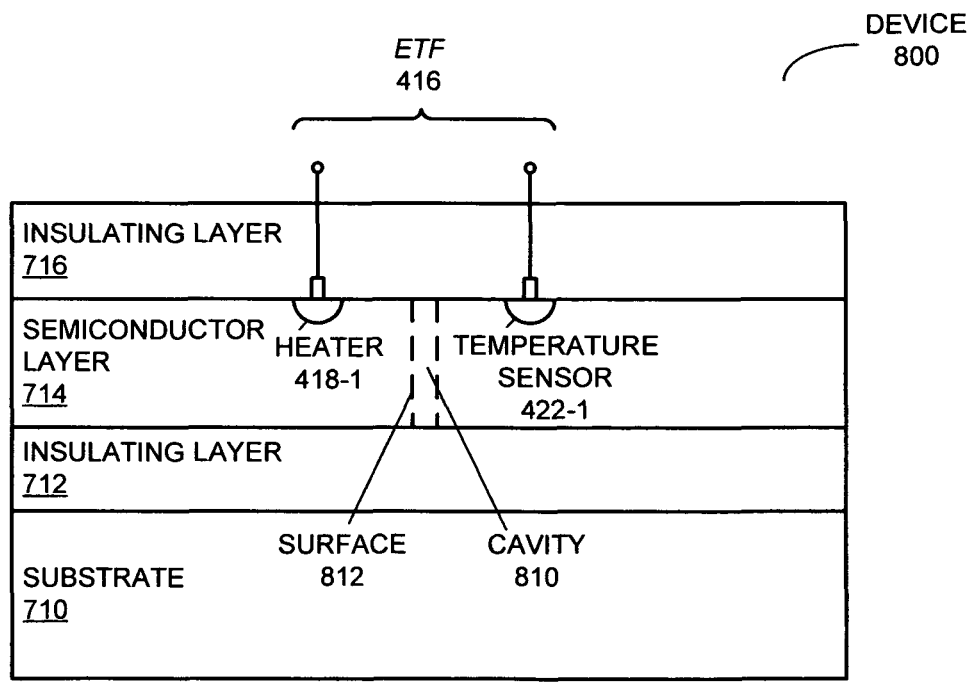
FIG. 8 is a drawing illustrating a device in accordance with an embodiment.

In contrast with FIG. 7, which illustrates an embodiment of ETF 414, FIG. 8 presents a drawing illustrating a device 800 in which ETF 416 includes the material. In particular, ETF 416 may include at least one cavity 810 (such as a trench), defined by a surface 812, in semiconductor layer 714. This cavity, which may be along thermal path 42-2 (FIG. 4) of ETF 416, may include the material other than the semiconductor (such as: polysilicon, a gate isolation oxide, a field isolation oxide and/or a trench isolation oxide). For example, cavity 810 may be filled with the material.

In the embodiments shown in FIGS. 7 and 8, the time constant (and, thus, $\phi_{ETF1}$) may be substantially associated with the thermal diffusivity of the semiconductor, and the second time constant (and, thus, $\phi_{ETF2}$) may be substantially associated with the thermal diffusivity of the material. For example, the time constant may be dominated by the thermal diffusivity of the semiconductor, and the second time constant may be dominated by the thermal diffusivity of the material. Stated differently, $\phi_{ETF2}$ may be larger than $\phi_{ETF1}$ by a phase associated with the trench $\phi_{trench}$ (and, more generally, cavity 810). Because is dominated by the oxide (and, more generally, the material), the difference between $\phi_{ETF1}$ and $\phi_{ETF2}$ may also be a measure for $\phi_{OX}$ (which may be nearly temperature independent). Thus, 428 (FIG. 4) may be a function of the thermal diffusivity of the semiconductor and the thermal diffusivity of the material. For example, signal 428 (FIG. 4) may be a near-linear function of a ratio of the thermal diffusivity of the semiconductor to the thermal diffusivity of the material.

As noted previously, the device may be used to provide an ETF-based temperature sensor (such as an integrated temperature sensor). In these embodiments, $\phi_{ox}$ may provide a temperature-insensitive time reference in the thermal domain that removes the need for an external time reference. This is shown in FIG. 9, which presents a block diagram illustrating a dual ETF-based temperature sensor 900 that performs a ratiometric measurement of R equal to $\phi_{ETF1}/\phi_{trench}$, which is nearly temperature independent and is not sensitive to the extact value off $f_{drive}$. Note that in this temperature sensor, drive circuit 410 may provide phase-reference signals 910, and measuring the phase-shift value and the second phase-shift value may involve digitizing $\phi_{ETF1}$ and $\phi_{ETF2}$ based on the phase-reference signals.

During operation of temperature sensor 900, ETFs 414 and 416 (which each may have s equal to 8 μm) may be driven at $f_{drive}$, which can be generated based on an (inaccurate) on-chip RC oscillator (which may have an oscillator frequency of approximately 6.4 MHz). Moreover, digital logic may divide the oscillator frequency by 128 to generate $f_{drive}$ (which may be equal to 50 kHz) and to generate the phase-reference signals (which may have 2.8125° phase steps) for the phase digitizers in phase detector 426, which use these to output digital approximations of $\phi_{ETF1}$ and $\phi_{ETF2}$ (i.e., the phase-shift value and the second phase-shift value) Then, the outputs of the phase digitizers may be digitally processed by output circuit 912 to yield the absolute temperature ($T_{abs}$), which may be a near-linear function of R. Because both $\phi_{ETF1}$ and $\phi_{ETF2}$ have similar dependence on $f_{drive}$, note that the inaccuracy and temperature sensitivity of the RC oscillator may not significantly affect the measurement of $T_{abs}$. As a consequence, the inaccuracy of an implementation of the temperature sensor 900 from −70 to 200 C has been measured to be ±0.4 C (3σ). With a 5 V supply, the power consumption of this implementation of temperature sensor 900 was about 5 mW. Furthermore, continuous operation of ETFs 414 and 416 in this implementation had a temperature-sensing resolution of 0.075 C (rms) at 0.7 conversions/second.

Note that, because the time scale of temperature changes in integrated circuits is on the order of seconds, $\phi_{ETF1}$ and $\phi_{ETF2}$ can be assumed to be constant during the phase detection. This may enable the use of an efficient two-step phase digitizer, in which a given phase-shift value (which can be the phase-shift value or the second phase-shift value) may be first coarsely determined within a phase range, for example, using a single-slope analog-to-digital converter. Then, the given phase-shift value may be finely determined by considering a second phase range that is smaller than the phase range (for example, the phase range may be ±45° and the second phase range may be ±2.8125°). In an exemplary embodiment, the given phase-shift value may be accurately digitized using a first-order, single-bit phase-domain sigma-delta modulator (PDΣΔM). This approach may improve the linearity by 4700× and may reduce the quantization noise of phase detector 426 by 16×, thereby enabling accurate phase detection.

Moreover, as noted previously, the device may be used to provide an EFLL-based frequency reference. FIG. 10 presents a block diagram illustrating an EFLL-based frequency reference 1000. In this frequency reference, the stringent requirements on the accuracy of the temperature compensation may be significantly relaxed, because ETF 416, which provides a frequency reference based on $D_{SiO2}$, may have significantly reduced temperature dependence. In frequency reference 1000, the device temperature may be provided by an on-chip band-gap temperature sensor 1010, such as a bipolar junction transistor (BJT). However, as known to one of skill in the art, a wide variety of temperature sensors may be used, such as a calibrated resistor or a metal-oxide-semiconductor field-effect transistor (MOSFET).

During operation of frequency reference 1000, the phase-shift values may be determined by a digital implementation of phase detector 426 (such as a phase-domain sigma-delta modulator PDΔΣM). The PDΔΣM's bitstream output may be compared with a phase reference $\phi_{SET}$ (such as 90°) provided by phase-reference circuit 1012 using a comparison circuit. The resulting error signal may be integrated by a digital filter and fed back, via a digital-to-analog converter (DAC), to the drive circuit 410, such as a VCO (which together may constitute a digitally controlled oscillator or DCO). Note that the VCO may be voltage or current controlled.

Alternatively, the BJT-based temperature sensor may be avoided altogether by using a dual ETF configuration to create a self-compensated $D_{SiO2}$ frequency reference. This is shown in FIG. 11, which presents a block diagram illustrating a self-compensated EFLL-based frequency reference 1100.

Based on preliminary measurements, the inaccuracy of an implementation of this frequency reference may be below 250 ppm.

Note that frequency reference 1100 may eliminate the need for external components (such as capacitors) and/or exotic devices (such as post-processing or MEMS structures), thereby facilitating full CMOS integration. Furthermore, frequency reference 1100 may provide a stable on-chip frequency reference over a wide range of process and temperature variations. This frequency reference may be: more accurate than RC and ring oscillators; may dissipate less power than LC oscillators; and may scale well with process.

One challenge associated with $D_{SiO2}$ ETFs is that they can be quite sensitive to small variations in layer thickness, e.g., because of a spread in oxidation time. This is in contrast with $D_{Si}$ ETFs, whose accuracy is accurately determined by planar lithography. However, layer thickness variations can accurately be compensated for by at least a single-point calibration. Thus, in some embodiments of FIG. 4, phase detector 426 may provide signal 428 based on a calibration setting or a trim setting (such as a temperature-calibration setting, e.g., multiplying by K in output circuit 912 in FIG. 9), which may have been determined by comparing signal 428 to a reference, and which may reduce errors in signal 428. For example, the temperature-calibration setting may be stored in an optional storage component 436 in device 400, such as: a non-volatile memory, an array of resistors, a memory circuit and/or a fusable link. Note that the calibration setting may be determined from the coefficients of a polynomial, which may be implemented in the digital domain. For example, a fifth-order polynomial may be used. Alternatively or additionally, a look-up table, a cubic spline and/or an interpolation technique may be used.

Figure 12:
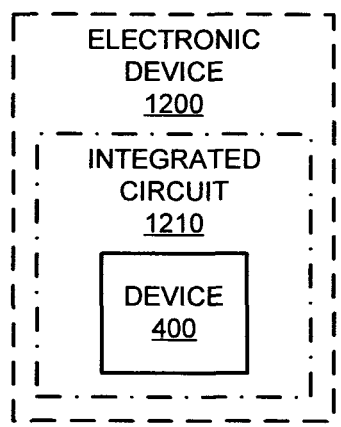
FIG. 12 is a block diagram of an electronic device that includes the device of FIG. 4 in accordance with an embodiment.

The preceding embodiments of the device may be used in a wide variety of applications, including: an integrated (on-chip) temperature sensor, a discrete temperature sensor, intra-chip communication, inter-chip communication, an integrated frequency reference, a clock source for use in one or more time domains, a multi-core processor, a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a portable electronic device (such as a personal digital assistant, an MP3 player and a cellular telephone) and/or a non-portable electronic device. As a general illustration, FIG. 12 presents a block diagram of an electronic device 1200 that includes an integrated circuit 1210, where device 400 is implemented on integrated circuit 1210.

While the present disclosure has been described in connection with specific embodiments, the claims are not limited to what is shown. Consequently, the preceding embodiments may include fewer components or additional components. For example, in an embodiment of an EFLL-based frequency reference, drive signal 412 (FIG. 4) output by drive circuit 410 (FIG. 4) may be adjusted or modified based on one or more additional parameters other than a temperature-dependent parameter. For example, signal 424-2 (FIG. 4) may be adjusted based on stress, doping or a geometry of device 400 in FIG. 4 (or an associated process monitor), thereby correcting signal 424-1 (FIG. 4) for variations in the one or more additional parameters. Moreover, two or more components in one or more of the preceding embodiments may be combined into a single component and/or a position of one or more components may be changed.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

In some embodiments, functionality in these circuits, components and devices is implemented in hardware and/or in software as is known in the art. For example, some or all of the functionality of these embodiments may be implemented in one or more: application-specific integrated circuit (ASICs), field-programmable gate array (FPGAs), and/or one or more digital signal processors (DSPs). Furthermore, the circuits and components may be implemented using bipolar, PMOS and/or NMOS gates or transistors, and signals in these embodiments may include digital signals that have approximately discrete values and/or analog signals that have continuous values. Thus, drive signal 412 (FIG. 4) generated by drive circuit 410 (FIG. 4) may be a continuous signal or a pulsed signal (such as a signal with pulses at edges that correspond to $f_{drive}$). Additionally, components and circuits may be single-ended or differential, and power supplies may be unipolar or bipolar.

While several of the preceding embodiments of the device 400 represent the phase or phase-shift values in the digital domain, in other embodiments the phase or phase-shift values are represented by analog signals. Thus, while the implementation of the device has been illustrated with embodiments based on a digital implementation, an analog implementation can be used.

Moreover, while the preceding embodiments of the EFLL-based frequency reference output an approximately fixed fundamental frequency, in other embodiments the fundamental frequency output by the EFLL-based frequency reference is adjustable or selectable. For example, the output of a digitally-controlled oscillator circuit may be digitally divided (or multiplied) before it is applied to the ETFs. Thus, $f_{drive}$ may be adjusted continuously over one or more ranges. Alternatively or additionally, the fundamental frequency may be selected from a predefined set of discrete values. In some embodiments, an array of EFLL-based frequency references is used to provide the predefined set of discrete values, which each may be fixed or which may be adjustable over an associated range of frequencies.

Furthermore, while the implementation of the ETFs in the preceding embodiments was illustrated using a semiconductor substrate (such as silicon), a wide variety of materials with a temperature-dependent thermal diffusivity (such as a ceramic or a plastic) can be used in other embodiments. Alternatively or additionally, the underlying principle of the device may be applied to other physical phenomenon in addition to or separate from the temperature-dependent thermal diffusivity of the semiconductor or the material in the ETFs. For example, using a suitable plastic substrate, hydroscopic effects (such as those associated with relative-humidity changes) or adhesion of a chemical (such as a gas or a compound that reacts with the material) may be used to modify the thermal diffusivity of one or more ETFs in a predefined or predetermined manner. This can form the basis of a closed-loop compensated circuit (such as an EFLL) and, thus, a sensor for the other physical phenomenon.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 13:
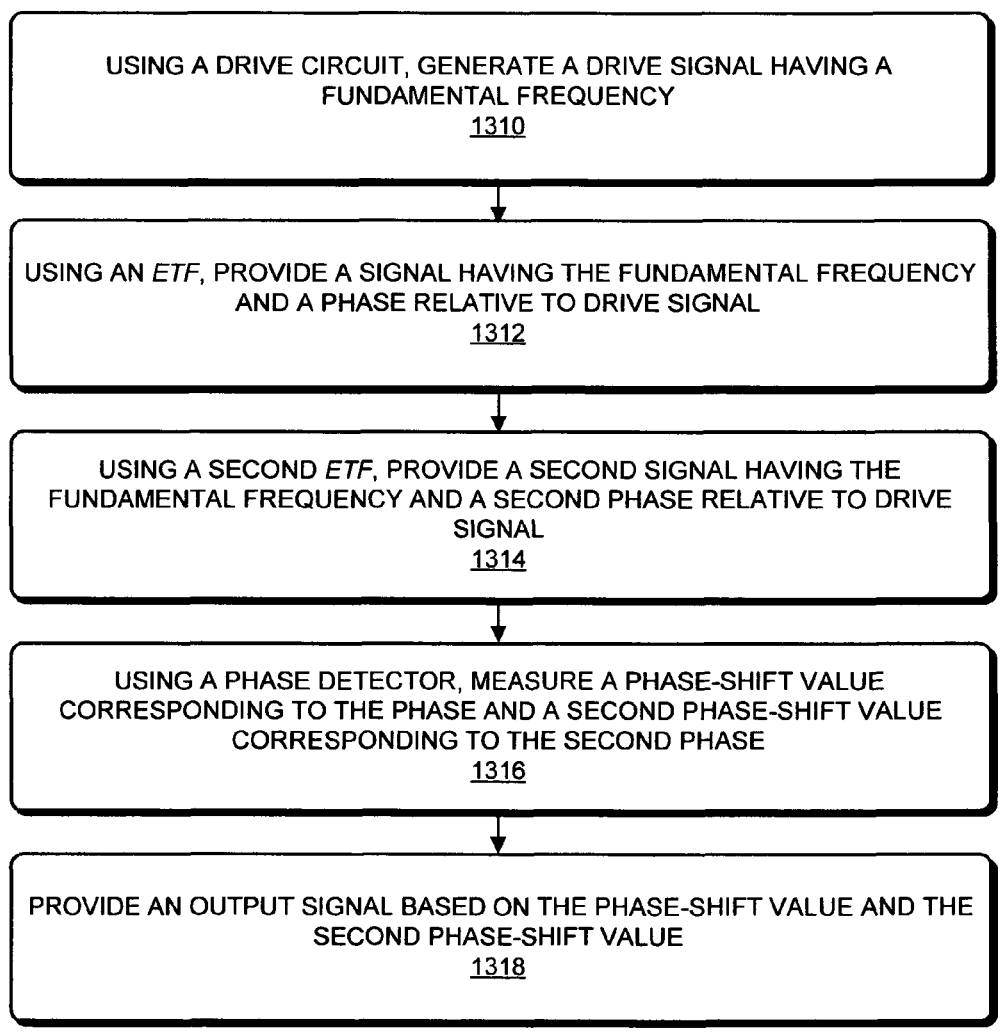
FIG. 13 is a flow chart illustrating a method for providing an output signal using the device of FIG. 4 in accordance with an embodiment.

We now describe embodiments of the method. FIG. 13 presents a flow chart illustrating a method 1300 for providing an output signal using a device, such as device 400 (FIG. 4). During operation, the drive circuit in the device generates the drive signal having the fundamental frequency (operation 1310). In response to the drive signal, the ETF in the device (which has the temperature-dependent time constant) provides the signal having the fundamental frequency and the phase relative to the drive signal (which corresponds to the time constant) (operation 1312). Similarly, in response to the drive signal, the second ETF in the device (which has the second temperature-dependent time constant) provides the second signal having the fundamental frequency and the second phase relative to the drive signal (which corresponds to the second time constant) (operation 1314). Then, the phase detector in the device measures the phase-shift value corresponding to the phase and the second phase-shift value corresponding to the second phase (operation 1316). Moreover, the device provides the output signal based on the phase-shift value and the second phase-shift value (operation 1318).

In some embodiments, method 1300 includes additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. Therefore, the spirit and scope of the appended claims should not be limited to the foregoing description. Only those claims specifically reciting "means for" or "step for" should be construed in the manner required under the sixth paragraph of 35 U.S.C. §112.

What is claimed:

1. A device, comprising:
 a drive circuit configured to generate a drive signal, having a fundamental frequency;
 an electrothermal filter (ETF), electrically coupled to the drive circuit, the ETF having a temperature-dependent time constant, wherein the ETF is configured to provide a signal having the fundamental frequency and a phase relative to the drive signal corresponding to the time constant;
 a second ETF, electrically coupled to the drive circuit, the second ETF having a second temperature-dependent time constant which is different than the time constant, wherein the second ETF is configured to provide a second signal having the fundamental frequency and a second phase relative to the drive signal corresponding to the second time constant; and
 a phase detector, electrically coupled to drive circuit, the ETF and the second ETF, configured to measure a phase-shift value corresponding to the phase and a second phase-shift value corresponding to the second phase, and configured to output a signal based on the phase-shift value and the second phase-shift value.

2. The device of claim 1, wherein the signal corresponds to a value that is a function of a temperature of the device.

3. The device of claim 1, further comprising a compensation circuit, electrically coupled to the chive circuit and the phase detector, to compensate for temperature-dependent frequency changes in the fundamental frequency output by the drive circuit to make at least one of the phase-shift value and the second phase-shift value substantially equal to a temperature-dependent phase reference so that the fundamental frequency is approximately independent of the temperature.

4. The device of claim 3, wherein the temperature-dependent phase reference is based on the phase-shift value and the second phase-shift value.

5. The device of claim 3, further comprising:
   a temperature sensor configured to measure a temperature of the device; and
   a phase-reference circuit that provides the temperature-dependent phase reference based on the measured temperature.

6. The device of claim 1, wherein the device is disposed on a substrate that includes a semiconductor;
   wherein the time constant is substantially associated with a thermal diffusivity of the semiconductor; and
   wherein the second time constant is associated with a thermal diffusivity of a material disposed on the substrate which is other than the semiconductor.

7. The device of claim 6, wherein the signal is a function of the thermal diffusivity of the semiconductor and the thermal diffusivity of the material.

8. The device of claim 1, further comprising:
   a substrate;
   an insulating layer disposed on the substrate; and
   a semiconductor layer disposed on the insulating layer, wherein the semiconductor layer includes a semiconductor.

9. The device of claim 8, further comprising a second insulating layer, which includes a material other than the semiconductor, disposed on the semiconductor layer;
   wherein the time constant is substantially associated with a thermal diffusivity of the semiconductor; and
   wherein the second time constant is substantially associated with a thermal diffusivity of the material.

10. The device of claim 9, wherein the signal is a function of the thermal diffusivity of the semiconductor and the thermal diffusivity of the material.

11. The device of claim 8, wherein the second ETF includes at least one cavity, defined by a surface, in the semiconductor layer;
    wherein the cavity includes a material other than the semiconductor; and
    wherein the cavity is along a heat-diffusion path of the second ETF.

12. The device of claim 1, wherein the second ETF provides a time reference for the device in the thermal domain so that the device is self-referenced without an external time reference.

13. The device of claim 1, wherein the drive circuit provides phase-reference signals; and
    measuring the phase-shift value and the second phase-shift value involves digitizing the phase and the second phase based on the phase-reference signals.

14. The device of claim 1, wherein the signal is a function of the phase-shift value and the second phase-shift value.

15. The device of claim 1, wherein the phase detector provides the signal based on a temperature-calibration setting.

* * * * *